United States Patent
Li et al.

(10) Patent No.: US 6,426,371 B1
(45) Date of Patent: Jul. 30, 2002

(54) SOL MATERIALS

(75) Inventors: Lih-Ping Li, Taipei; Li-Mei Chen, Hsinchu; Chao-Jen Wang, Kaoushung; Hsin-Hsen Lu, Hsinchu, all of (TW)

(73) Assignees: Industrial Technology Research Institute, Hsinchu; Chinese Petroleum Corporation, Taipei; Taiwan Fertilizer Co., Ltd., all of (TW)

( * ) Notice: Subject to any disclaimer, the term of this patent is extended or adjusted under 35 U.S.C. 154(b) by 0 days.

(21) Appl. No.: 09/346,075

(22) Filed: Jul. 1, 1999

(30) Foreign Application Priority Data

Apr. 2, 1999 (TW) ........................................ 88105295 A

(51) Int. Cl.[7] .............................. C01B 33/14; B01F 3/12
(52) U.S. Cl. .............................. 516/34; 516/86; 501/12; 106/287.11; 106/287.13
(58) Field of Search ................ 516/34, 86; 501/12; 106/287.11, 287.13

(56) References Cited

U.S. PATENT DOCUMENTS

| 4,652,467 A | 3/1987 | Brinker et al. | 427/246 |
|---|---|---|---|
| 5,525,643 A | 6/1996 | Macip-Boulis et al. | 521/154 |
| 5,565,142 A | 10/1996 | Deshpande et al. | 252/62 |
| 5,723,368 A | 3/1998 | Cho et al. | 438/624 |
| 5,944,866 A | * 8/1999 | Chen et al. | 501/12 |
| 6,017,389 A | * 1/2000 | Schmidt et al. | 501/12 |
| 6,156,223 A | * 12/2000 | Sigel et al. | 501/12 |
| 6,171,645 B1 | * 1/2001 | Smith et al. | 427/96 |

FOREIGN PATENT DOCUMENTS

WO   WO 97/11035   * 3/1997

* cited by examiner

Primary Examiner—Daniel S. Metzmaier
(74) Attorney, Agent, or Firm—Darby & Darby

(57) ABSTRACT

The invention provides a fast-cured sol material, which is produced by hydrolysis and condensation of the following starting materials: 2–60 parts by weight of a silicon alkoxide; 20–98 parts by weight of an alcohol; 0.5–50 parts by weight of an aqueous media; 0.0001–10 parts by weight of a base; 0.001–30 parts by weight of at least one additive; and optionally 0.0001–10 parts by weight of an acid. A coating of the sol material according to the invention can be directly cured (without aging) to obtain a microporous dielectric film without shrinkage or cracks.

11 Claims, No Drawings

SOL MATERIALS

BACKGROUND OF THE INVENTION

1. Field of the Invention

The present invention relates in general to sol materials. More particularly, it relates to sol materials that can be applied to substrates to form microporous dielectric films.

2. Description of the Related Arts

In order to prevent the gel films from shrinking (or even cracking) during drying, it generally requires a long term standing from about 1 day to 1 month for polymer gelation and aging in the sol-gel process for making porous dielectric films. It is believed that the microstructure of the gel is strengthened during the standing process and thus prevents the gel structure from collapsing due to capillary pressure produced by drying. In addition, the shrinking or cracking problem can be solved by surface modification of the resulting films. It is reported that the gel strength can also be improved by surface modification of the preliminary structure of the gel. In any case, however, the standing or the surface modification process has greatly reduced the throughput in practical applications. Accordingly, it would be advantageous to obtain sol materials that on one hand have a long shelf life for storage, and on the other hand can be promptly converted into microporous gels when being used.

PRIOR ART

U.S. Pat. No. 4,652,467 discloses a method of coating a substrate with a polymeric thin film of predetermined porosity. Prior to depositing the film, the structure of the polymer is controlled by (a) adjusting the water content, the pH, and the temperature of a non-gelled solution, and (b) lowering the temperature of the solution to about 15° C. or lower to trap the solution in a state in which, after the deposition step, a coating of the desired porosity will be obtained. Prior to lowering the temperature, the solution is aged at 50° C. for a minimum of 6 days to grow polymer to correct size.

U.S. Pat. No. 5,525,643 describes microporous aerogel and xerogel compositions which are prepared by a random polymerization reaction of a silanol-terminated polydimethylsiloxane (PDMS), tetraethylorthosilicate (TEOS), and/or methyltriethoxysilane (MTEOS) to form a gel. The gel is aged for a period of at least about 24 hours before drying to obtain the xerogel or aerogel.

U.S. Pat. No. 5,565,142 describes an extremely porous xerogel dried at vacuum-to-below supercritical pressures but having the properties of aerogels which are typically dried at supercritical pressures. This is done by reacting the internal pore surface of the wet gel with organic substances in order to change the contact angle of the fluid meniscus in the pores during drying. The process consists of a series of aging, washing, and/or surface modification steps which are undertaken upon the wet gel before drying, where the aging step is performed at an elevated temperature for a period of 24–46 hours.

U.S. Pat. No. 5,723,368 describes a porous dielectric material with improved pore surface properties, in which the porous film is treated with a halogen-containing gas to dehydroxylate the pore surface and thereby improve its dielectric properties.

SUMMARY OF THE INVENTION

As set forth above, the known materials for forming microporous dielectric films require either aging for at least 24 hours, or surface modification after gel formation to prevent shrinking or cracking of the films. It is therefore an object of the invention to provide a sol material that can be applied to a substrate and directly cured, without aging or the after-surface-modification to prevent shrinkage or cracking, to form a microporous dielectric film.

In addition, to our knowledge the commercially available low-k materials used nowadays, such as FOX-14 (Dow Corning Company) and PAE-2 (Schamacher Company) must be stored at a low temperature of about 5° C. It is a further object of the invention to provide a sol material that can be stored at room temperature.

To attain the above objects, the present invention provides a sol material, in the preparation of which an additive is added thereto to control the polymer size and modify the polymer surface as well. The additive, added at the synthesis stage, not only lengthens the shelf life of the sol material, but also enables the coating of which to be directly cured without aging or surface modification. The sol material of the invention is produced by hydrolysis and condensation of the starting materials comprising: 2–60 parts by weight of a silicon alkoxide; 20–98 parts by weight of an alcohol; 0.5–50 parts by weight of an aqueous media; 0.0001–10 parts by weight of a base; 0.001–30 parts by weight of at least one additive; and optionally 0.0001–10 parts by weight of an acid; in which the additive is different from the silicon alkoxide, the alcohol, the base, and the acid.

According to a feature of the invention, the above mentioned additive used for surface modification and particle size controlling is added at the synthesis stage of the sol material. To the contrary, in the prior methods the surface modification is typically carried out when the gel is partially, or completely formed.

In accordance with the invention the sol material thus prepared is stable at room temperature for storage; moreover, it can be promptly converted into a microporous gel with a wide range of porosities without being substantially aged. Therefore, the sol materials according to the invention are particularly suitable for forming dielectric microporous films. The sol materials according to the invention are also applicable to making insulation films, ceramic materials, optical films, and so forth.

DETAILED DESCRIPTION OF THE INVENTION

As described earlier, the sol materials of the invention are prepared from several starting materials through hydrolysis and condensation reactions. In the following, each of the starting materials used for preparing the sol materials will be described.

The silicon alkoxides suitable for use in the present invention has the formula: $R^1{}_n Si(OR^2)_{4-n}$, wherein each of $R^1$ and $R^2$, independently, is H or $C_{1-4}$ alkyl, and n is an integer from 0 to 3. The most commonly used silicon alkoxide is tetraethylorthosilicate (TEOS). Typically the alcohols used in the invention are methanol, ethanol, or a mixture thereof, and the aqueous media can be de-ionized water or distilled water.

In accordance with the invention, a base catalyst, and optionally an acid catalyst, is employed to adjust the pH value of the solution and thereby to control the diameter of the ultra-fine sol particles. The base catalysts suitable for use herein can be inorganic bases, organic bases, or mixtures thereof. Illustrative examples of suitable base catalysts include hydroxylamine and ethylenediamine. The acid catalysts suitable for use herein can be inorganic acids, organic acids, or mixtures thereof. Illustrative examples of suitable acid catalysts include hydrochloric acid, nitric acid, phosphoric acid, and acetic acid.

In accordance with the invention, at least one additive was added at the synthesis stage of sol solution preparation for surface modification and particle size controlling purposes. This is distinct from conventional methods in which the surface modification is undertaken upon a gel. The additives suitable for use in the invention have the structures of $R'_nSi(OCH_3)_{4-n}$, $R'_nSi(OC_2H_5)_{4-n}$, $R'COOH$, $R(OH)_m$, or $R'_nSiCl_{4-n}$, wherein R' is H, phenyl, $C_{1-20}$ alkyl, alkenyl, amino, substituted amino, or an ester group; R is phenyl, $C_{1-20}$ alkyl, alkenyl, amino, substituted amino, or an ester group; n is an integer from 0 to 3; and m is an integer from 1 to 3. Representative examples of such additives include methyltriethoxysilane (MTEOS), benzoic acid, ethylene glycol, N-phenylaminopropyltrimethoxysilane, and phenylmethyldichlorosilane.

The sol material produced by hydrolysis and condensation of the above described materials is fast-cured, and can be directly applied to substrates by known processes to form low-dielectric, microporous films with high thermal stability. For example, the sol material can be coated onto the surface of a substrate by spin coating or by dipping process. Microporous dielectric films with porosities ranging from 5 to 80% can be obtained after curing the coated substrate, with no aging needed.

Without intending to limit it in any manner, the present invention will be further illustrated by the following examples. In all of the following examples, the refractive indices were determined using Nanospec (AFT 4000), and unless otherwise specified the dielectric constants were derived from the refractive indices according to the following formula:

$$Dk=1+6.33(n-1),$$

where Dk represents dielectric constant and n represents refractive index.

EXAMPLE 1

A sol solution was prepared by subjecting the following starting materials and amounts to hydrolysis and condensation in a reaction vessel for 8 hours:

| Starting material | Amount (wt %) |
|---|---|
| TECS | 9.3 |
| Alcohol (methanol:ethanol) | 83 |
|  | (6.1:1.1) |
| Deionized water | 3 |
| Nitric acid | 0.62 |
| Hydroxylamine | 0.67 |
| MTEOS (additive) | 3.41 |

The freshly prepared (unaged) sol solution was spin coated on a silicon substrate and dried, resulting in a microporous thin film with a refractive index of 1.155, the dielectric constant derived from the refractive index being 1.98. No shrinkage, cracks, or warpage was observed with the thin film.

EXAMPLE 2

A sol solution was prepared by subjecting the following starting materials and amounts to hydrolysis and condensation in a reaction vessel for 6 hours:

| Starting material | Amount (wt %) |
|---|---|
| TEOS | 9 |
| Alcohol (methanol:ethanol) | 88.3 |
|  | (3.6:1) |
| Deionized water | 1.7 |
| Nitric acid | 0.15 |
| Hydroxylamine | 0.65 |
| Benzoic acid (additive) | 0.04 |

The freshly prepared (unaged) sol solution was spin coated on a silicon substrate and dried, resulting in a microporous thin film with a dielectric constant of 3.08. No shrinkage, cracks, or warpage was observed with the thin film.

EXAMPLE 3

A sol solution was prepared by subjecting the following starting materials and amounts to hydrolysis and condensation in a reaction vessel for 5 hours:

| Starting material | Amount (wt %) |
|---|---|
| TEOS | 10.5 |
| Alcohol (methanol:ethanol) | 86.4 |
|  | (14.6:1) |
| Deionized water | 1.98 |
| Hydroxylamine | 0.76 |
| Phenylmethyldichlorosilane (additive) | 0.29 |

The freshly prepared (unaged) sol solution was spin coated on a silicon substrate and dried, resulting in a microporous thin film with a dielectric constant of 3.03. No shrinkage, cracks, or warpage was observed with the thin film.

EXAMPLE 4

A sol solution was prepared by subjecting the following starting materials and amounts to hydrolysis and condensation in a reaction vessel for 8 hours:

| Starting material | Amount (wt %) |
|---|---|
| TEOS | 8.7 |
| Alcohol (methanol:ethanol) | 88 |
|  | (3.1:1) |
| Deionized water | 1.7 |
| Nitric acid | 0.5 |
| Hydroxylamine | 0.63 |
| N-phenylaminopropyltrimethoxysilane (additive) | 0.3 |

The freshly prepared (unaged) sol solution was spin coated on a silicon substrate and dried, resulting in a microporous thin film with a porosity of 35% as measured by a Module VB-200 ellipsometer (J.A. Woollam Company). No shrinkage, cracks, or warpage was observed with the thin film. The dielectric constant (Dk) of the thin film was 2.88 as derived from the porosity as follows:

$$\xi\%=1-(d/2.27),\ d=(n-1)0.202,\ \text{and}\ Dk=1+6.33(n-1),$$

where $\xi$ represents porosity, d represents density, n represents refractive index, and Dk represents dielectric constant.

EXAMPLE 5

A sol solution was prepared by subjecting the following starting materials and amounts to hydrolysis and condensation in a reaction vessel for 8 hours:

| Starting material | Amount (wt %) |
| --- | --- |
| TEOS | 10 |
| Alcohol (methanol:ethanol) | 82.3 |
|  | (13.4:1) |
| Deionized water | 3.3 |
| Hydrochloric acid | 0.03 |
| Hydroxylamine | 0.72 |
| MTEOS (additive) | 3.6 |

The freshly prepared (unaged) sol solution was spin coated on a silicon substrate and dried resulting in a microporous thin film with a dielectric constant of 2.86. No shrinkage, cracks, or warpage was observed with the thin film.

EXAMPLE 6

A sol solution was prepared by subjecting the following starting materials and amounts to hydrolysis and condensation in a reaction vessel for 8 hours:

| Starting material | Amount (wt %) |
| --- | --- |
| TEOS | 7.6 |
| Alcohol (methanol:ethanol) | 71.2 |
|  | (4.6:1) |
| Deionized Water | 16.7 |
| Nitric acid | 1.2 |
| Ethylenediamine | 0.5 |
| MTEOS (additive) | 2.8 |

The freshly prepared (unaged) sol solution was spin coated on a silicon substrate and dried, resulting in a microporous thin film with a porosity of 18% as measured by a Module VB-200 ellipsometer (J.A. Woollam Company). The dielectric constant (Dk) of the thin film was 3.38 as derived from the porosity. No shrinkage, cracks, or warpage was observed with the thin film.

EXAMPLE 7

A sol solution was prepared by subjecting the following starting materials and amounts to hydrolysis and condensation in a reaction vessel for 6 hours:

| Starting material | Amount (wt %) |
| --- | --- |
| TEOS | 10 |
| Alcohol (methanol:ethanol) | 81.3 |
|  | (22..8:1) |
| Deionized water | 2.3 |
| Acetic acid | 1.9 |
| Hydroxylamine | 0.74 |
| MTEOS (additive) | 3.7 |

The freshly prepared (unaged) sol solution was spin coated on a silicon substrate and dried, resulting in a microporous thin film with a dielectric constant of 2.66. No shrinkage, cracks, or warpage was observed with the thin film.

EXAMPLE 8

A sol solution was prepared by subjecting the following starting materials and amounts to hydrolysis and condensation in a reaction vessel for 6 hours:

| Starting material | Amount (wt %) |
| --- | --- |
| TEOS | 5.4 |
| Alcohol (methanol) | 91 |
| Deionized water | 0.98 |
| Hydroxylamine | 0.38 |
| MTEOS (additive) | 1.9 |

The freshly prepared (unaged) sol solution was spin coated on a silicon substrate and dried, resulting in a microporous thin film with a porosity of 71% as measured by a Module VB-200 ellipsometer (J.A. Woollam Company). The dielectric constant (Dk) of the thin film was 1.81 as derived from the porosity. No shrinkage, cracks, or warpage was observed with the thin film.

While the invention has been particularly shown and described with the reference to the preferred embodiment thereof, it will be understood by those skilled in the art that various changes in form and details may be made without departing from the spirit and scope of the invention.

What is claimed is:

1. A sol material, which is produced by hydrolysis and condensation of the starting materials comprising:

a) 2–60 parts by weight of a silicon alkoxide;

b) 20–98 parts by weight of an alcohol;

c) 0.5–50 parts by weight of an aqueous media;

d) 0.0001–10 parts by weight of a base; and e) 0.001–30 parts by weight of at least one additive different from said silicon alkoxide, wherein said additive is selected from the group consisting of benzoic acid and N-phenylaminopropyltrimethoxysilane.

2. The sol material as claimed in claim 1, wherein said silicon alkoxide is $R^1_n Si(OR^2)_{4-n}$, wherein each of $R^1$ and $R^2$, independently, is H or $C_{1-4}$ alkyl, and n is an integer from 0 to 3.

3. The sol material as claimed in claim 2, wherein said silicon alkoxide is tetraethylorthosilicate (TEOS).

4. The sol material as claimed in claim 1, wherein said alcohol is selected from the group consisting of methanol, ethanol, and a mixture thereof.

5. The sol material as claimed in claim 1, wherein said aqueous media is de-ionized water.

6. The sol material as claimed in claim 1, wherein said aqueous media is distilled water.

7. The sol material as claimed in claim 1, wherein said base is selected from the group consisting of organic bases, inorganic bases, and mixtures thereof.

8. The sol material as claimed in claim 7, wherein said base is selected from the group consisting of hydroxylamine, ethylenediamine, and a mixture thereof.

9. The sol material as claimed in claim 1, wherein said starting materials further comprise 0.0001–10 parts by weight of an acid which is different from said additive.

10. The sol material as claimed in claim 9, wherein said acid is selected from the group consisting of organic acids, inorganic acids, and mixtures thereof.

11. The sol material as claimed in claim 10, wherein said acid is selected from the group consisting of hydrochloric acid, nitric acid, phosphoric acid, acetic acid, and mixtures thereof.

* * * * *